United States Patent [19]
Droege

[11] 3,959,527
[45] May 25, 1976

[54] FLAT COSTUME JEWELRY AND METHOD FOR THE SURFACE TREATMENT THEREOF

[76] Inventor: Lee John Droege, 11 Karlann Drive, Rte. 4, Golden, Colo. 80401

[22] Filed: Apr. 8, 1974

[21] Appl. No.: 458,541

[52] U.S. Cl. .................. 427/259; 63/32; 96/36; 96/38.1; 148/6.24; 148/31.5; 156/8; 427/264; 427/265; 428/28; 428/457
[51] Int. Cl.² .................................. B44D 1/52
[58] Field of Search .............. 156/3, 8, 11, 13, 18; 63/32; 427/264, 272, 276, 259, 265; 148/6.24, 31.5; 428/28, 457; 96/32, 36, 36.2, 36.3, 38.1

[56] References Cited
UNITED STATES PATENTS

| 282,485 | 8/1883 | Baynes | 96/38.1 |
|---|---|---|---|
| 1,937,146 | 11/1933 | Gries | 96/38.1 |
| 1,942,686 | 1/1934 | Colbert et al. | 96/38 X |
| 2,102,162 | 12/1937 | Nierenberg | 156/11 X |
| 2,521,648 | 9/1950 | Ott | 156/13 |
| 3,462,982 | 9/1969 | Celeste | 96/35.1 |
| 3,813,310 | 5/1974 | Droege et al. | 156/3 |

FOREIGN PATENTS OR APPLICATIONS

| 8,950 | 11/1891 | United Kingdom | 156/11 |

Primary Examiner—William A. Powell
Assistant Examiner—Brian J. Leitten
Attorney, Agent, or Firm—Van Valkenburgh, Lowe & Law

[57] ABSTRACT

Costume jewelry is manufactured through photofabrication processes from flat metal sheets to form items such as earrings and small pendants. A standard photo-fabrication operation includes covering a metal sheet with a layer of photosensitive, chemically resistive material commonly referred to as a photoresist. Portions of the covered sheet are exposed to light to outline the earrings and pendants on the sheet. The sheet is then developed and the exposed metal surface portions are chemically etched to remove excess metal and form the earrings and pendants. Thereafter, surface treatments involve supplementary photofabrication operations to provide different colors and finishes on the earrings and pendants by etching, plating and staining the exposed metal surfaces, all of which are supplemented by the retention of portions of photoresist layers of selected colors.

10 Claims, 18 Drawing Figures

U.S. Patent   May 25, 1976   Sheet 1 of 3   3,959,527
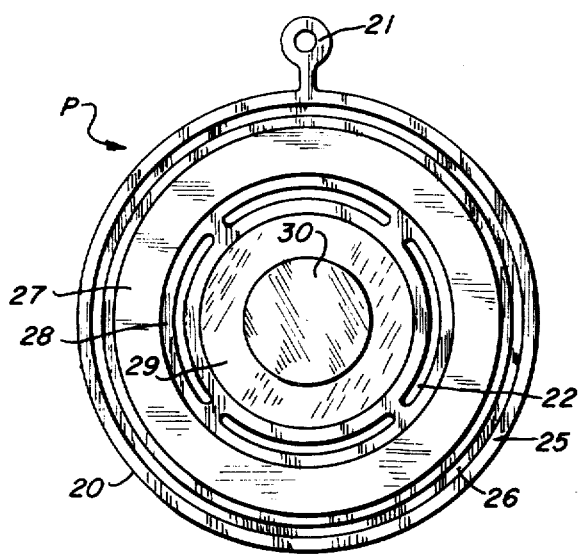
Fig_1
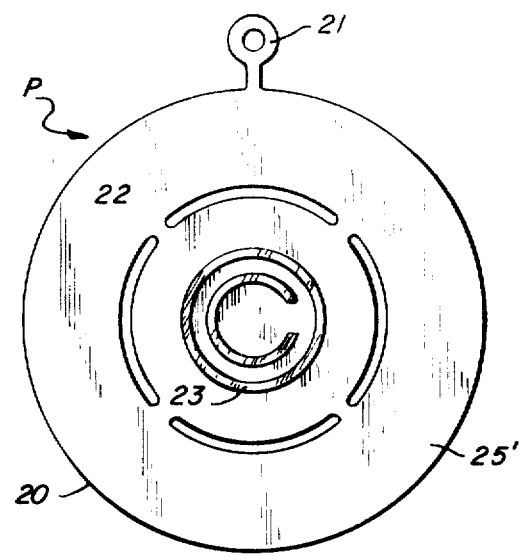
Fig_2
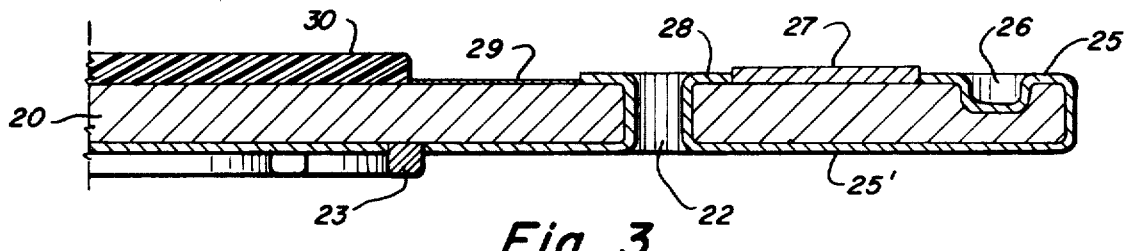
Fig_3
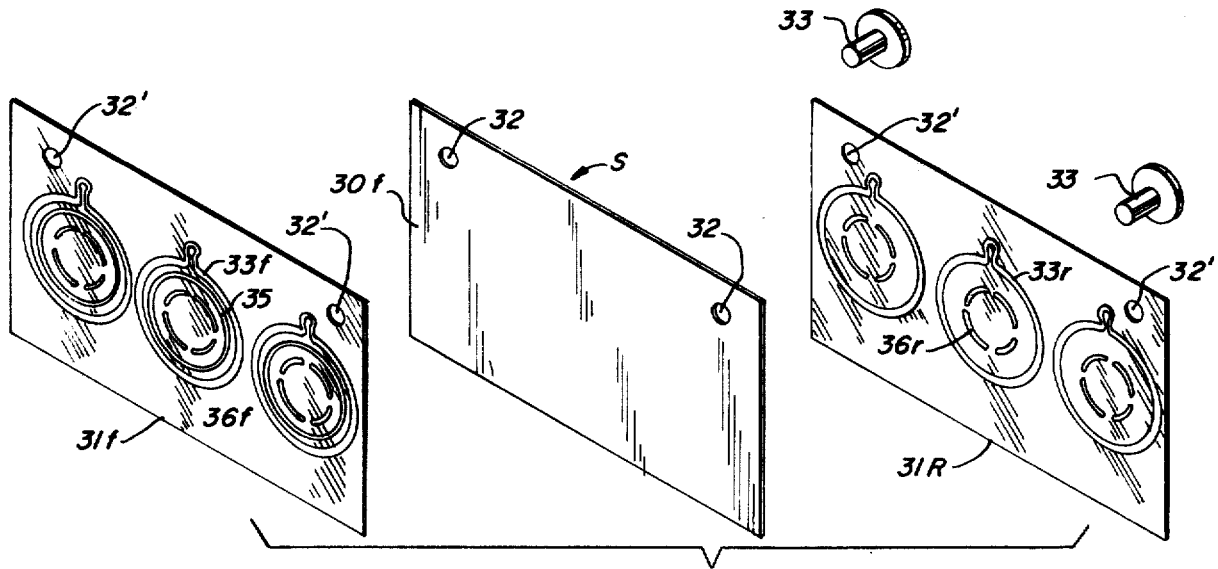
Fig_4
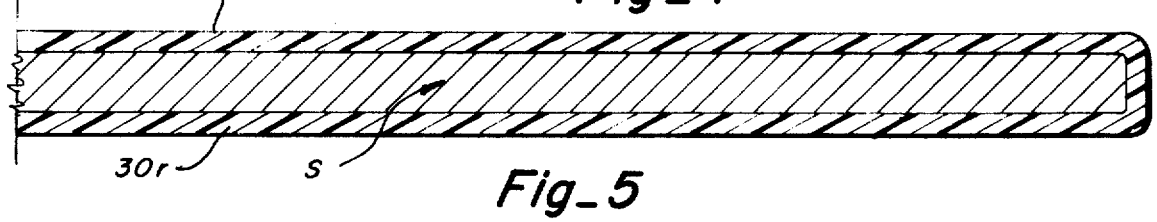
Fig_5

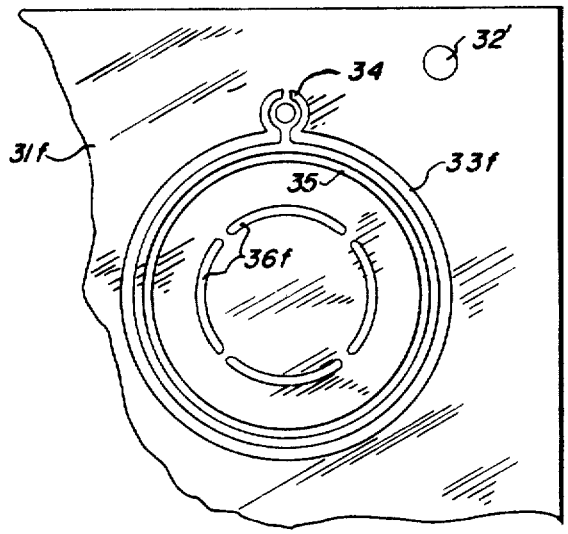
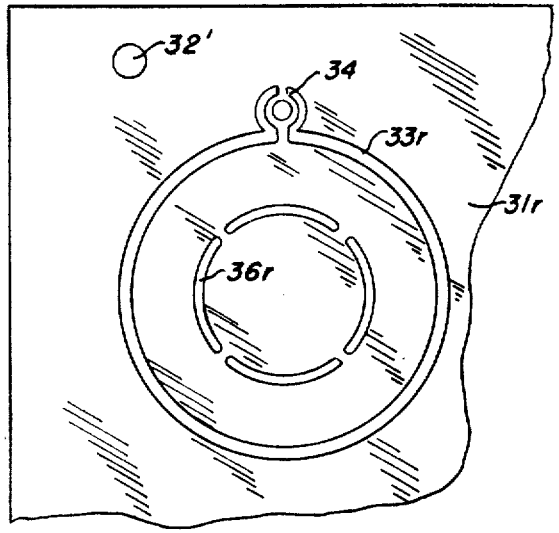
Fig_6  Fig_6a
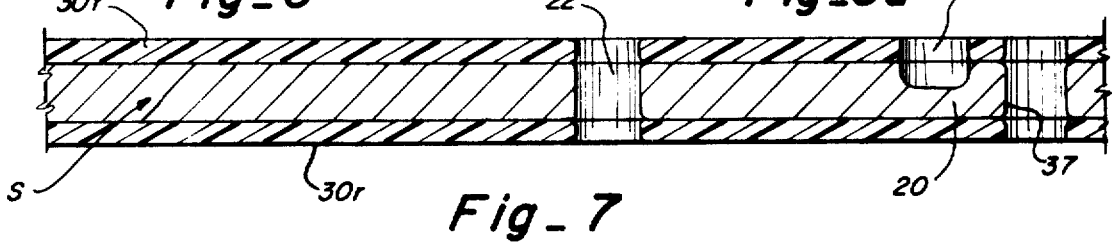
Fig_7
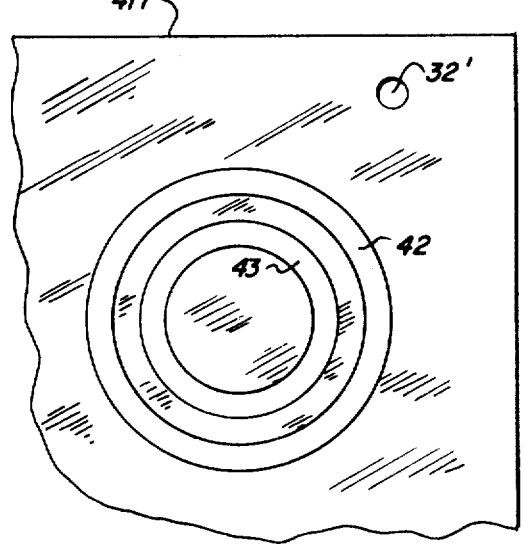
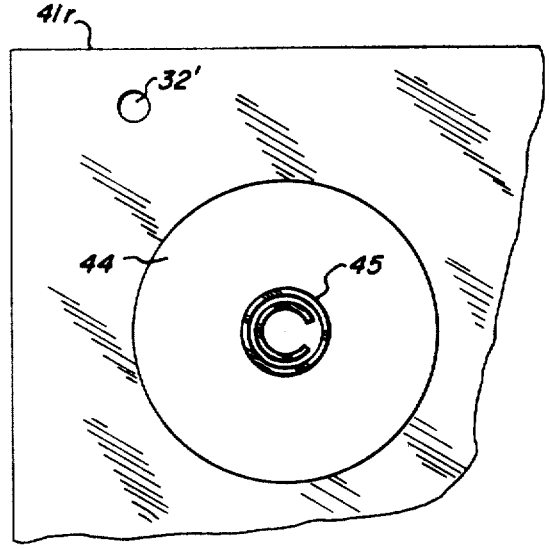
Fig_8  Fig_8a
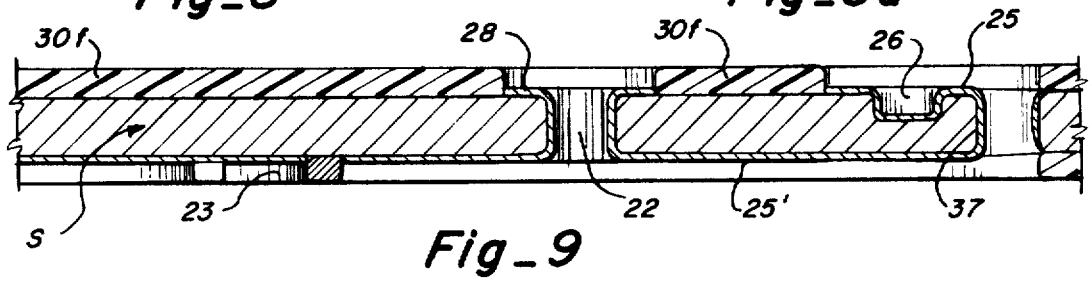
Fig_9

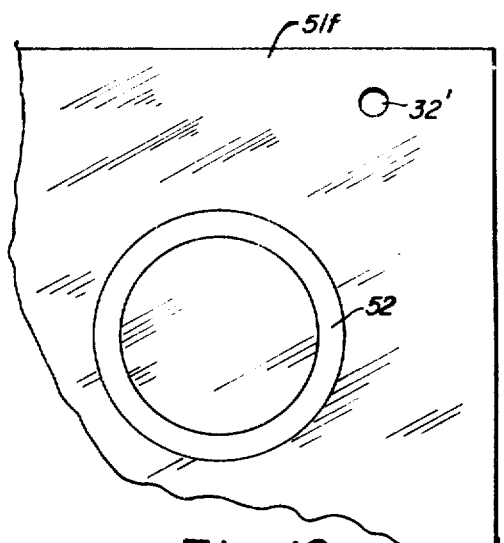
Fig_10
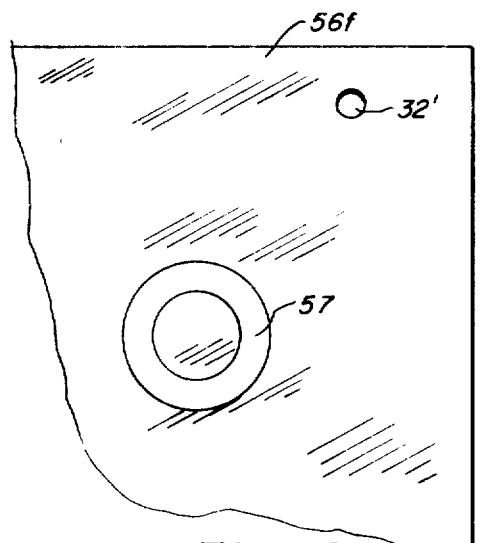
Fig_12
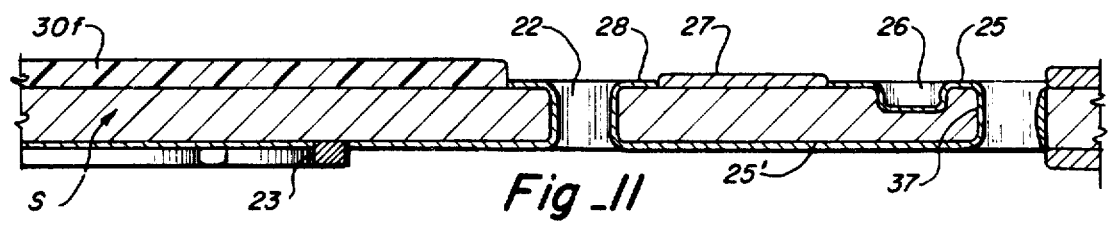
Fig_11
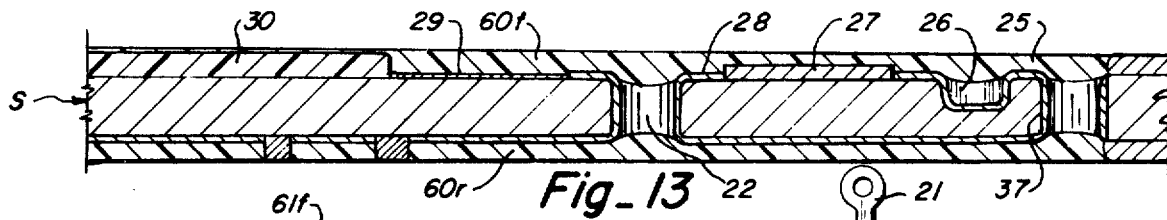
Fig_13
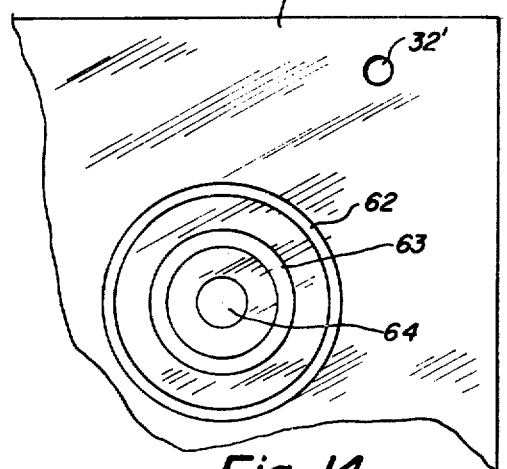
Fig_14
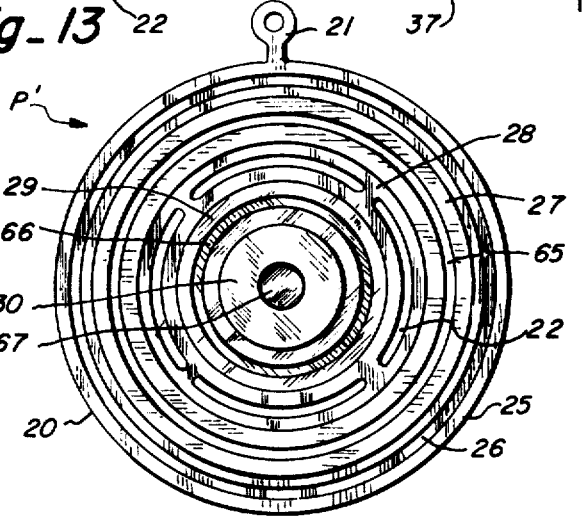
Fig_16
Fig_15

FLAT COSTUME JEWELRY AND METHOD FOR THE SURFACE TREATMENT THEREOF

This invention relates to costume jewelry, and more particularly to the manufacture of small items of costume jewelry, such as earrings and pendants, from flat metal sheets, and through processes which include photofabricating, chemical, milling and electroplating operations upon flat metal production sheets to obtain various intricate designs of costume jewelry, hereinafter sometimes referred to as "flat costume jewelry."

A primary object of the present invention is to provide novel and improved flat costume jewelry, such as earrings and pendants, which have intricate, pleasing, contrasting surface patterns obtained by combining etched, stained and plated treatments to the surface of the jewelry item.

Another object of the invention is to provide in items of flat costume jewelry, such as earrings or pendants, reproductions having sharp, clear detail, in intricate patterns of art work and replicas of animate and inanimate objects upon the face of the jewelry.

Another object of the invention is to provide novel and improved methods for the surface treatment of flat costume jewelry which involves steps and sequences to produce intricate designs and replicas of animate and inanimate objects.

Another object of the invention is to provide a novel and improved method for the manufacture of flat costume jewelry, such as earrings and pendants, which combine simple steps and sequences for the surface treatment of jewelry items by etching, staining and plating the surfaces of the items to produce intricate artistic patterns of sharp detail and good contrast.

Another object of the invention is to provide a novel and improved method for producing flat costume jewelry items having sharply defined, intricate, contrasting surface patterns through a simple, but effective mode of supplementing the conventional photofabrication operations for outlining the items in a metal production sheet without the need for special equipment.

Another object of the invention is to provide a novel and improved method for the manufacture of flat costume jewelry through photofabrication operations which can provide sharp detail to the finished products sufficient to permit tiny designs and legends, such as copyright notices, to clearly appear on very small items of costume jewelry, such notices being important to protect the proprietor of the jewelry against unwarranted copying by others.

Yet other objects of the invention are to provide novel and improved flat costume jewelry items which are neat-appearing, of high quality and low in cost; and novel methods for the manufacture of the same through simple, easily controlled, reliable, easily reproducible steps.

With the foregoing and other objects in view, our present invention comprises certain constructions, combinations and arrangements of materials, and sequences, operations and steps, all as hereinafter described in detail, defined in the appended claims and illustrated in the accompanying drawings in which:

FIG. 1 is a front elevation view of a simple pendant exemplary of an item of flat costume jewelry manufactured according to the present invention, the figure being on an enlarged scale to better set forth contrasting surface areas provided by different surface treatments;

FIG. 2 is a rear view of the pendant shown at FIG. 1;

FIG. 3 is a fragmentary sectional view as taken from the indicated line 3—3 at FIG. 1, but on a greatly enlarged scale and exaggerated in thickness to better illustrate the different surface treatments;

FIG. 4 is an isometric exploded view of a metal production sheet whereon pendants are to be formed and the photographic masking sheets which are to be attached to the front and rear surfaces of this production sheet during photographic operations to expose portions of photoresist layers upon the sheet;

FIG. 5 is a fragmentary sectional view on a greatly enlarged scale through a metal production sheet having both surfaces prepared with photoresist layers preparatory to the manufacture of a pendant such as shown at FIG. 1;

FIG. 6 is a plan view of a corner of the front face masking sheet which is to be registered against the front face of the production sheet to provide the first phase of the process;

FIG. 6a is a plan view of a corner of a rear face masking sheet which is registered against the rear face of the production sheet and is used in conjunction with the masking sheet of FIG. 6;

FIG. 7 is an enlarged fragmentary sectional view of the production sheet of FIG. 5 after exposure with the sheets of FIGS. 6 and 6a in registration against the production sheet and after subsequently developing and etching the production sheet, the view corresponding in location to the indicated line 7—7 at FIG. 6;

FIGS. 8 and 8a are plan views of corners of front and rear face masking sheets similar to the showing at FIGS. 6 and 6a which are to be registered against the front and rear faces of the production sheet to provide the second phase of the process, the transparent portions of these masking sheets being selected to expose additional areas on the production sheet;

FIG. 9 is an enlarged fragmentary sectional view of the production sheet of FIG. 5 after exposure with the sheets of FIGS. 8 and 8a in registration against the production sheet and after subsequently developing and electroplating a first metal layer upon the production sheet, the view corresponding in location to the indicated line 9—9 at FIG. 8;

FIG. 10 is a plan view of a corner of a front face masking sheet which is to be registered against the front face of the production sheet to provide a third phase of the process, the transparent portion of the masking sheet being selected to expose additional areas on the production sheet;

FIG. 11 is an enlarged sectional view of the production sheet of FIG. 5 after exposure with the sheet of FIG. 10 in registration against the production sheet and after subsequently developing and immersion plating a second metal layer upon the production sheet, the view corresponding in location to the indicated line 11—11 at FIG. 10;

FIG. 12 is a plan view of a corner of a front face masking sheet which is to be registered against the front face of the production sheet to provide a final phase of the process, resulting in a product having the cross section of FIG. 3 wherein the metal surface exposed by the masking sheet is finished by metal staining;

FIG. 13 is a fragmentary sectional view similar to FIG. 3, but illustrating the finished production sheet and the pendants upon it as being covered by a second layer of photoresist to permit a repeat of some of the operational sequences of FIGS. 1–12, to provide additional surface treatments on the pendant;

FIG. 14 is a plan view of a corner of a front face masking sheet which is to be registered against the front face of the production sheet of FIG. 13 to provide yet another sequence of operations, the transparent portion of the masking sheet being selected to expose areas on the production sheet which may or may not overlap previously exposed areas;

FIG. 15 is an enlarged fragmentary sectional view of the production sheet of FIG. 13 after exposure with the masking sheet of FIG. 14 in registration with it and after subsequently developing the photoresist to remove the exposed areas of photoresist preliminary to further electroplating operations, the view corresponding in location to the indicated line 15—15 at FIG. 14; and FIG. 16 is a front elevation view of a pendant similar to FIG. 1, but with additional contrasting areas provided by the operations set forth in FIGS. 13, 14 and 15.

The manufacture of low cost, costume jewelry is a large industry wherein each manufacturer strives to produce high quality, low cost items in an effort to better compete with foreign imports. In the past decade, a procedure for manufacturing costume jewelry from flat sheets by chemical milling processes has been introduced to make flat costume jewelry items. This procedure involves photofabrication steps wherein a flat metal production sheet is covered with a chemically resistant photosensitive material, commonly called "photoresist." The sheet is covered with "masks," that is, patterns outlining the jewelry items, and it is then subjected to light to expose the portions of photoresist at the transparent sections of the masks. The sheets are then developed to leave protective surfaces of photoresist upon portions of the sheet, including the jewelry items outlined on the masks, which are to remain intact. Other portions of the production sheet, such as the outline of the jewelry items, have metal surfaces exposed and these exposed surfaces are subsequently milled or eroded by chemical action such as with a spray of ferric chloride. With this process, intricate outlines of flat, costume jewelry items can be quickly and easily manufactured at a low unit cost.

The present invention concerns refinements and improvements in this basic operation of manufacturing costume jewelry to produce different, contrasting surfaces on the jewelry items after the items are outlined on the production sheet. A number of surface treatments are possible including electroplating or immersion plating with many different kinds of metal such as gold, silver, platinum, nickel and copper. Also, the metal surfaces of the production sheet may be stained. Finally, portions of the layer of photoresist may be colored and allowed to remain on the jewelry item. This is accomplished by sequentially exposing and removing selected areas of photoresist from the surface of the jewelry items and either etching or applying coatings to the exposed surfaces which may be metal layers or may be stains.

The present invention is best understood and described with reference to the manufacture of a simple item of costume jewelry such as a flat, circular pendant and the drawings and description exemplify in detail a sequence of such manufacture and surface treatments which are possible according to the present invention. This pendant is also exemplary of a structure which embodies the present invention and it is to be realized that many variations of form and surface patterns of an earring or pendant other than that described are possible.

The pendant P, illustrated at FIGS. 1, 2 and 3, has a flat, circular body 20 with a suitable connector eye 21 at its top for receiving a wire loop or clasp. Although this body is illustrated as being several inches in diameter, the size may vary and the present invention is especially suited for the manufacture of very small pendants are earrings. This circular pendant, a flat brass sheet, is provided with arcuate, concentric windows 22. The front face of the pendant is covered with several finishes, as will be described, while the rear face is plain with the exception of a copyright symbol 23 at the center, as illustrated at FIG. 2.

The body 20 of the pendant has surface finishes at its front face arranged in concentric ring-like patterns. Commencing at the outer edge of the body, a gold plated peripheral ring 25 includes an etched channel 26 at its center. A ring 27 lies within the embrace of the ring 25 and is silver plated to provide a distinctive white or silver-colored surface contrasting with the yellow gold ring 25. A gold plated ring 28 lies within the embrace of the silver plated ring 27, and the windows 22 are located in this ring, as illustrated. A ring 29 lies within the embrace of the gold plated ring and this ring 29 is formed as the exposed brass surface of the body 20, and is colored by a chemical stain. Finally, a nave 30 is located at the center of the pendant within the embrace of the ring 29. This nave 30 is a colored, photoresist material which was not removed from the pendant.

The rear face of the pendant is coated with a gold plate 25' at all portions, excepting at the copyright symbol 23 which is formed of the original photoresist material. The metal sheet forming the body 20, though preferably of brass, may be of any other suitable metal which can be coated with photoresist and etched with solutions such as ferric chloride. Although the rings 25, 27 and 28 are described as being gold and silver plated, other plating metals are available. It is to be noted that whenever two metals are to be plated, the first may be electroplated and the second may be immersion plated, however, the second must be higher in the electromotive series than the first but lower in the electromotive series than the body 20, the brass sheet, for the body to accept the plating. The other metal plating such as the gold plating will reject the same. The metals, which may be plated onto the pendant and onto other similar flat costume jewelry items, include gold, silver, nickel and copper. The colors thus obtained will be yellow, white, metallic or grey and red. Also, it is possible to obtain a black nickel plate coating. Plating is possible by electroplating, using a proper potential, or by immersion or chemical plating where deposit is by ion replacement. The techniques of electroplating are well known to the art and need not be described in detail.

In addition to obtaining various colors by plating operations, the brass surface of the body 22 may be colored by dyes or by inducing a chemical reaction to the brass surface. For example, a solution of nickel ammonium sulphate and sodium thiosulfate will react to the brass surface, or copper surface, to color the same green. Also, different sulphide salts will react to stain a brass or copper surface to a variety of colors, from yellow to dark green, depending upon the type of solution and the time of immersion in the solution.

Such is well known in the art and literature. Also, a skilled technician will have various proprietary combinations available to him which are sometimes referred to as "witches brews."

Preferably, a production sheet of brass is used in the manufacture of flat costume jewelry items, such as the sheet S shown at FIG. 4. The front and rear sides of this sheet S are covered by a photoresist layer 30f and 30r, respectively, as shown at FIG. 5. These layers are hard, translucent and adhere tightly to the brass sheet and can provide an enameled appearance to the finished product such as at the nave 30 at FIG. 1.

Several types of photoresist materials are available on the market and are manufactured as proprietary products. One type, known as a positive acting photoresist, is known as Shipleys AZ-111 produced by the Shipley Company of California. These resists are ordinarily mildly colored such as a pale yellow or a pale blue. However, the same can be obtained tinted or dyed in a number of colors: red, orange, yellow, green, blue and purple. In conventional operations with photoresist material, as in printed circuits boards, any intense coloration is undesirable. However, in the present invention, manufacture of an item of costume jewelry where the photoresist is to become part of the finished surface of the jewelry item, the situation is otherwise and colored photoresists are desirable. A selected color can easily be obtained by a technician and hence need not be described further.

FIGS. 4 and 5 are illustrative of the basic step for manufacturing several pendants with a production sheet S and the pendants will remain on this sheet until they are finished. Preferably, this production sheet S is a flat, brass sheet and is coated with photoresist layers 30f and 30r, as heretofore described. Before application, the photoresist is colored to a desired tint, and the color may differ at the front and rear sides, depending upon the desired color of the nave 30 and the symbols 23 of the finished pendant P. In the following operational steps, it is necessary to use a positive resist, that is, a type which remains on the sheet S if it is not exposed to a developmental light. It is to be noted that a negative resist, which remains on the sheet only if exposed, is commonly used but cannot be used in the present invention since in the present invention, portions of the positive resist will be removed step by step by repeated exposures.

The portions of the resist at the front and rear sides of the sheet S which are to be exposed will be retricted by masks overlying the sheet S. The first set of masks to be used will be mask 31f at the front face of the sheet S and a mask 31r at the rear side. The masks, sometimes referred to as negative transparencies, are formed of transparent plastic sheets coated with photographic emulsion which renders the sheets opaque at all portions except where it is desired to permit light to pass through them to expose the photoresist surfaces on the production sheets. When placed against the front and rear faces of the production sheet, each mask is registered at a proper position upon the production sheet in any suitable manner such as by providing small corner holes 32 in the production sheet and corresponding holes 32' in the mask to receive suitable pins 33 which hold production sheets S between the sandwich of masks 31f and 31r. The steps of exposing and developing the production sheet S using such masks to remove selected portions of photoresist and expose the brass surface of the production sheet are conventional and need not be described herein.

The first and essentially conventional step in the sequence is to expose the production sheet when it is sandwiched between the outline masks 31f and 31r which are illustrated at FIG. 4 and also portions of the masks are illustrated at FIGS. 6 and 6a. The front mask 31f includes a transparent ring 33f which outlines the pendant body 20 and the connector eye 21 leaving a small neck 34 attaching the eye to the body of the sheet to hold the pendant in place for subsequent operations. This sheet also includes a transparent ring 35 which corresponds to the etched channel 26 on the pendant and transparent arcuate segments 36f which correspond with windows 22 of the pendant. The rear sheet includes an outline ring 33r, outlining the pendant, which matches the outline ring 33f, and transparent arcuate segments 36r which match the transparent segments 36f.

The worksheet S is exposed, developed and etched to produce the result indicated at FIG. 7. The portions of the photoresist removed at the outline rings 33f and 33r and segments 36f and 36r expose metal at both sides of the worksheet which will be etched through. This will outline each pendant at 37 on the production sheet S, which is held in place by a neck 34. It will also form the windows 22. The exposure of the photoresist at the ring 35 removes that ring to form the channel 26 at the front face of the pendant since it will be etched through the worksheet about half way. Thus, by etching the pendant at both sides of the sheet, the cutting through and channeling steps, as described, may be done simultaneously. However, a partial etching to cut a channel in the face of the pendant may be a separate step using another front mask having only the transparent ring 35 and eliminating that ring 35 from the mask 31f.

A subsequent step in the process is illustrated at FIGS. 8, 8a and 9. A new set of masks 41f and 41r is provided with registration holes 32' for placing against the production sheet S for exposure of additional portions of the photoresist 30f and 30r. The front mask 41f is provided with two transparent rings 42 and 43 which correspond with the gold plated surface rings 25 and 28 of the pendant at FIG. 1. The rear mask 41r is provided with a circular opening 44 which encompasses the entire rear face of the pendant, excepting for a opaque copyright symbol mark 45 at the center of the opening. This copyright symbol is exemplary of any sort of pattern which may be desired and ordinarily where the pendants are to be finished on one face only, the rear face is ideal for any marks such as 45 to identify the proprietor of the pendant, to place a copyright notice or the like thereon.

When the production sheet S is sandwiched between the registering masks 41f and 41r, exposed and developed, certain portions of the photoresist surfaces will be removed. All of the photoresist at the back side of the sheet will be removed, except that portion showing the symbol mark 23, while portions at the front face of the photoresist, outlining the rings 25 and 28 of the pendant P of FIG. 1, will be removed. Thereafter the surfaces of these rings 25 and 28 are gold plated. At the same time, the rear surface 25' of the pendant 20 is gold plated. Also, this plating operation will deposit a thin layer of gold at the outer edge 37 of the pendant and layers of gold at the edges of the windows 22, all as illustrated at FIG. 9.

A subsequent step in the process is illustrated at FIGS. 10 and 11. A new mask 51f is provided with registration holes 32' for placing it against the front face of the production sheet for exposure of additional portions of the photoresist 30f. This front mask 51f is provided with a transparent ring 52 which corresponds with the silver plated surface ring 27 of the pendant at FIG. 1. A blank rear mask, not shown, may be provided to cover the rear face of the production sheet since the operations are completed at the rear face. When the production sheet is sandwiched between the registering mask 51f and a blank mask at the rear, exposed and developed, that portion of the photoresist surface outlining the ring 27 at the front face of the pendant of FIG. 1 will be removed. Thereafter, the surface of this ring 27 is silver plated by an immersion plating operation, such being possible since the gold plating surface responds to a lower level on the electromotive series and will not enter into the reaction.

A mask for a final step in the process is illustrated at FIG. 12. This front mask 56f is provided with registration holes 32' for placing it against the front face of the production sheet S for exposure of additional portions of the photoresist 30f. The front mask 56f is provided with a transparent ring 57 which corresponds with the stained surface ring 29 of FIG. 1. When the production sheet S is sandwiched between the registering mask 56f at its front face and a blank mask at its rear face, exposed and developed, that portion of the photoresist surface outlining the ring 29 will be removed. Thereafter, the brass surface at this ring 29 may be stained to a suitable color, such as purple, and the remaining resist will form the nave 30 heretofore described to complete the pendant shown at FIG. 1 and in section at FIG. 3.

It is to be noted that the operations above described which involve repeated exposures to sequentially remove portions of the photoresist, can be selected so that one operation will not interfere with another. The process can be rendered more extensive, however, in what could be essentially a repeat of the overall operation by applying new layers 60f and 60r of photoresist to a production sheet S carrying the completed pendants, as illustrated at FIG. 13. Thereafter, additional layers of plating or even etching may be applied to the surfaces of the pendants on the production sheet S, directly over the previously plated layers.

To exemplify the use of the second application of photoresist on the production sheet carrying completed pendants such as illustrated at FIG. 13, a front mask 61f is provided with registration holes 32' to fit it upon the production sheet. This front mask 61f is provided with a transparent ring 62 which will lie at the silver coated ring 27 of the pendants, a second transparent ring 63 which will lie at the stained ring 29 and a transparent dot 64 at the center of the pendant which will lie over the nave 30, formed by the original photoresist layer 30f.

When the production sheet S is sandwiched between the registering mark 61f at its front face and a blank mask at its rear face, it is exposed and developed. That portion of the photoresist 60f at the rings 62 and 63, and the central dot 64 will be removed from the production sheet. The resulting openings will expose metal, and as illustrated at FIG. 15, the metal surfaces will be electroplated with nickel plating. A nickel plate ring 65 will be deposited upon the silver layer ring 27. A nickel plate ring 66 will be deposited upon the stained brass surface ring 69, and a nickel plate dot 67 will be deposited at the center of the nave 30, onto the original brass surface of the production sheet.

The pendant may then be finished by further exposure and development to remove this second layer of photoresist, leaving only the nave 30 at the front surface of the pendant and the symbol 23 at the rear surface. This is accomplished by using a front face mask similar to the face mask 56f but with a transparent ring wider than the transparent ring 57 to expose all of the pendant surface except the area forming the nave 30. The rear face of the production sheet is covered with a mask 41r having a surface arrangement 44 which exposes all of the rear face except for the symbol 45 thereon. After the production sheet is exposed between these masks, it is developed to remove the exposed photoresist and the front face of the final pendant will appear as shown at FIG. 16. The design on the face of the pendant shown at FIG. 16 is the same as that shown at FIG. 1, excepting for the nickel ring 65 at the center of the silver ring 27, the nickel ring 66 at the center of the stained ring 29 and the dot 67 at the center of the nave 30.

Another decorative arrangement which is possible with the process above set forth resides in modifying the steps disclosed at FIG. 9 by extending the photoresist 30f to the edges of the channel 26 so that the gold plated ring surface 25 will include only the channel 26. Thereafter, according to the step described at FIGS. 10 and 11, the silver plated ring 27 will extend to the edges of the channel 26. This produces a yellow gold colored surface in the channel and a silvered surface surrounding the channel, and in many designs, this is a desirable outstanding contrast, not only in the color of metals, but also in the levels of the surfaces.

It is to be again emphasized that the operations described for forming a pendant and a design upon the face of the pendant are exemplary of the several sequences to obtain varying patterns in accordance with the present invention. Thus, while I have described my invention in considerable detail, it is obvious that others skilled in the art can build and devise alternate and equivalent constructions and sequences and steps which are nevertheless within the spirit and scope of my invention. Hence, I desire that my protection be limited not by the constructions illustrated and described, but only by the proper scope of the appended claims.

I claim:

1. In the process for the manufacture of a pendant or the like formed as a thin sheet metal body wherein the body is produced from a production sheet of thin metal by the steps of:

coating the production sheet with a positive photoresist characterized by having light exposed portions removable from the sheet;

exposing a portion of the production sheet to outline the pendant thereon;

removing the exposed photoresist from the production sheet; and subjecting the production sheet to an etching solution to cut through the sheet and form the outline of the pendant, and the further steps of:

exposing only a selected portion of the photoresist covering the pendant; and removing this exposed portion of photoresist from the pendant surface to expose the metal forming the body of the pendant at this selected portion with photoresist remaining at other portions on the pendant.

2. The process defined in claim 1 including the further step of:

coloring the photoresist before coating the production sheet with photoresist.

3. The process defined in claim 1 including the further steps of:

metal plating the said exposed surface of the pendant body;

exposing another portion of the photoresist upon the body; and removing this exposed portion of photoresist whereby the pendant surface will include the metal plated portion, the exposed metal portion of the body and a portion covered by the photoresist.

4. The process defined in claim 3, wherein:

the metal plated to the surface is lower in the electromotive series than the metal forming the body of the pendant and including the further step of immersion plating the exposed metal portion of the body of the pendant with a solution of a metal which is higher in the electromotive series than the original metal plating but lower in the electromotive series than the metal forming the body.

5. The process defined in claim 4, including the further step of:

partially etching the first said exposed surface of the pendant body before metal plating this first said exposed surface.

6. The process defined in claim 1, including the further step of:

dipping the pendant in a solution chemically reactive to the exposed metal surface to color the same.

7. The process defined in claim 6, wherein:

the exposed metal surface is a copper based alloy and the solution includes a sulfide.

8. In the process for the manufacture of a plurality of pendants, or the like, formed as thin sheet metal bodies upon a production sheet of thin metal by the steps of:

a. coating the production sheet with a positive photoresist characterized by having light exposed portions removable from the sheet;

b. covering the production sheet with a first set of masks, at the front and rear sides of the production sheet and in mutual registration with the production sheet, said masks having transparent portions to outline the pendants to be formed in the production sheet with a narrow neck joining each pendant to the production sheet;

c. exposing the covered production sheet to light;

d. removing the masks and thereafter removing the exposed photoresist from the production sheet;

e. subjecting the production sheet to an etching solution to cut through the production sheet at the outline of the pendants to form the pendants, with the pendants remaining connected to the production sheet at the aforesaid necks;

f. covering the production sheet with a second set of masks, at the front and rear sides of the production sheet in mutual registration with the production sheet, said masks having transparent portions at selected areas upon each pendant;

g. exposing the covered production sheet to light;

h. removing the masks and thereafter removing the exposed portions of photoresist from the surfaces of the pendants to expose metal areas on the bodies of the pendants at said portions with photoresist remaining at other unexposed portions on the pendant; and i. severing the pendants from the production sheets at the aforesaid neck.

9. The process defined in claim 8, including the further step of:

applying an ornamental surface treatment to the exposed metal areas prior to the severing step.

10. The process defined in claim 8, including the further steps, prior to the severing step, of:

a. applying an ornamental surface treatment to the exposed metal areas;

b. covering the production sheet with a third set of masks, at the front and rear sides of the production sheet in mutual registration with the production sheet, said masks having transparent portions at other selected areas upon each pendant;

c. exposing the covered production sheet to light; and d. removing the masks and thereafter removing the said exposed portions of photoresist from the surfaces of the pendants to expose said other areas on the bodies of the pendants at said portions, with photoresist remaining at other unexposed portions on the pendants.

* * * * *